United States Patent
Wang et al.

(10) Patent No.: US 7,183,606 B2
(45) Date of Patent: Feb. 27, 2007

(54) FLASH MEMORY CELL AND MANUFACTURING METHOD THEREOF

(75) Inventors: Leo Wang, Hsinchu (TW); Chien-Chih Du, Hsinchu (TW); Da Sung, Hsinchu (TW); Chen-Chiu Hsue, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 63 days.

(21) Appl. No.: 11/160,743

(22) Filed: Jul. 7, 2005

(65) Prior Publication Data

US 2005/0255658 A1    Nov. 17, 2005

Related U.S. Application Data

(62) Division of application No. 10/707,735, filed on Jan. 8, 2004, now Pat. No. 6,953,963.

(30) Foreign Application Priority Data

Sep. 5, 2003    (TW) .............................. 92124559 A

(51) Int. Cl.
*H01L 29/788*    (2006.01)

(52) U.S. Cl. ............... 257/315; 257/686; 438/666; 438/299; 438/257; 438/303; 438/305

(58) Field of Classification Search ............... 257/315, 257/686, E21.252; 438/666, 299, 257, 303, 438/305

See application file for complete search history.

(56) References Cited

U.S. PATENT DOCUMENTS

| | | | | |
|---|---|---|---|---|
| 5,899,722 A | * | 5/1999 | Huang | 438/305 |
| 6,136,649 A | * | 10/2000 | Hui et al. | 438/257 |
| 6,194,784 B1 | * | 2/2001 | Parat et al. | 257/774 |
| 2003/0068859 A1 | * | 4/2003 | Leung et al. | 438/257 |

* cited by examiner

*Primary Examiner*—Andy Huynh
*Assistant Examiner*—Tram H. Nguyen
(74) *Attorney, Agent, or Firm*—Jianq Chyun IP Office

(57) ABSTRACT

A flash memory cell including a p-type substrate, an n-type deep well, a stacked gate structure, a source region, a drain region, a p-type pocket doped region, spacers, a p-type doped region and a contact plug is provided. The n-type deep well is set up within the p-type substrate and the stacked gate structure is set up over the p-type substrate. The stacked gate structure further includes a tunneling oxide layer, a floating gate, an inter-gate dielectric layer, a control gate and a cap layer sequentially formed over the p-type substrate. The source region and the drain region are set up in the p-type substrate on each side of the stacked gate structure. The p-type pocket doped region is set up within the n-type deep well region and extends from the drain region to an area underneath the stacked gate structure adjacent to the source region. The spacers are attached to the sidewalls of the stacked gate structure. The p-type doped region is set up within the drain region. The p-type doped region passes through the junction between the drain region and the p-type pocket doped region but is separated from the spacer by a distance. The contact plug is set up over the drain region and is electrically connected to the p-type doped region.

9 Claims, 8 Drawing Sheets

FLASH MEMORY CELL AND MANUFACTURING METHOD THEREOF

CROSS-REFERENCE TO RELATED APPLICATION

This application is a divisional of a prior application Ser. No. 10/707,735, filed Jan. 8, 2004, now U.S. Pat. No. 6,953,963 which claims the priority benefit of Taiwan application serial no. 92124559, filed Sep. 5, 2003.

BACKGROUND OF THE INVENTION

1. Field of the Invention

The present invention relates to a non-volatile memory device. More particularly, the present invention relates to a flash memory cell and manufacturing method thereof.

2. Description of the Related Art

Flash memory is a device that allows multiple data writing, reading and erasing operations. In addition, the stored data will be retained even after power to the device is removed. With these advantages, flash memory has been broadly applied in personal computer and electronic equipment.

A typical flash memory device has a floating gate and a control gate fabricated using doped polysilicon. The control gate is set up above the floating gate with an inter-gate dielectric layer separating the two. Furthermore, a tunneling oxide layer is also set up between the floating gate and an underlying substrate to form a so-called stacked gate flash memory cell.

FIG. 1 is a schematic cross-sectional view showing the structure of a conventional stacked gate flash memory cell (according to U.S. Pat. No. 6,214,668). As shown in FIG. 1, the flash memory includes of a p-type substrate 100, a deep n-well region 102, a p-type pocket doped region 104, a stacked gate structure 106, a source region 108, a drain region 110, spacers 112, an inter-layer dielectric layer 114, a contact plug 116 and a conductive line 118 (a bit line). The stacked gate structure 106 further includes a tunneling oxide layer 120, a floating gate 122, an inter-gate dielectric layer 124, a control gate 126 and a cap layer 128. The deep n-well region 102 is located within the substrate 100 and the stacked gate structure 106 is located above the p-type substrate 100. The source region 108 and the drain region 110 are located within the p-type substrate on each side of the stacked gate structure 106. The spacers 112 are attached to the sidewalls of the stacked gate structure 106. The p-type pocked doped region 104 is located within the deep n-well region 102 and extends from the drain region 110 to the area underneath the stacked gate structure 106. The inter-layer dielectric layer 114 is set above the p-type substrate 100. The contact plug 116 passes through the inter-layer dielectric layer 114 and the p-type substrate 100 and shorts the drain region 110 and the p-type pocket doped region 104 together. The conductive line 118 is positioned over the inter-layer dielectric layer 114 but is electrically connected to the contact plug 116.

In the aforementioned flash memory cell, the conductive line 118 (the bit line) connects through the contact plug 116 with the drain region 110 and the p-type pocked doped region 104 each having a different electrical conductive state. In general, the contact of the drain region 110 and the p-type pocked doped region 104 with the contact plug 116 is usually poor (a small contact area between the contact plug 116 and the drain region 110 due to vertical contact). Therefore, the electrical resistance near the drain region and the p-type pocket doped region 104 is unusually high or unstable when the memory cell is carrying out an operation (especially when the memory cell is carrying out a reading operation). An increase in electrical resistance often slows down device operation and leads to a drop in overall performance.

In addition, in the step of forming the contact plug 116, the inter-layer dielectric layer 114 and the p-type substrate 100 have to be etched so that a contact hole penetrating the inter-layer dielectric layer 114 and the drain region 110 is formed. Since the contact hole has a relatively high aspect ratio and two different types of materials (silicon oxide and silicon) need to be etched in the etching process, controlling the depth of the contact hole is very difficult. Furthermore, in a later stage processing operation, the contact plugs in the memory cell region and the contact plugs in the peripheral circuit region have to be formed separately. In other words, subsequent fabrication process is also quite complicated.

SUMMARY OF THE INVENTION

Accordingly, at least one objective of the present invention is to provide a flash memory cell and a manufacturing method thereof that can reduce the contact resistance between a bit line and a drain region or a p-type pocket doped region. Hence, reading current in each memory cell is increased and overall performance of the flash memory device is improved.

At least a second objective of this invention is to provide a flash memory cell and a manufacturing method thereof that can increase processing window and reduce the number of processing steps, production cost as well as time.

To achieve these and other advantages and in accordance with the purpose of the invention, as embodied and broadly described herein, the invention provides a flash memory cell. The flash memory cell includes a first conductive type substrate, a second conductive type well region, a stacked gate structure, a source region, a drain region, a first conductive type pocket doped region, spacers, a first conductive type doped region and a contact plug. The second conductive type well region is set up within the first conductive type substrate. The stacked gate structure is set up over the first conductive type substrate. The stacked gate structure further includes a tunneling oxide layer, a floating gate, an inter-gate dielectric layer, a control gate and a cap layer sequentially formed over the first conductive type substrate. The source region and the drain region are set up in the first conductive type substrate on each side of the stacked gate structure. The first conductive type pocket doped region is set up within the second conductive type well region and extends from the drain region to an area underneath the stacked gate structure adjacent to the source region. The spacers are attached to the sidewalls of the stacked gate structure. The first conductive type doped region is set up within the drain region. The first conductive type doped region passes through the junction between the drain region and the first conductive type pocket doped region but is separated from the spacer by a distance. The contact plug is set up over the drain region and is electrically connected to the first conductive type doped region.

In this invention, the first conductive type pocket doped region and the drain region are short-circuit connected together to facilitate reading data from the flash memory cell. Furthermore, by connecting drain region with the first conductive type pocket doped region together through the first conductive type doped region and separating the first conductive type doped region and the spacer by a distance (the distance is preferably greater than the depth of the drain region), the original vertical contact between the contact plug and the drain region is converted to a horizontal contact. Hence, the overall contact area between the contact plug and the drain region is increased and resistance between the contact plug and the first conductive type pocket doped region or the drain region is reduced. Ultimately, the flash memory cell can have a higher read-out rate and a better performance.

This invention also provides a method of fabricating a flash memory cell. First, a first conductive type substrate is provided. A second conductive type first well region is formed within the substrate and a stacked gate structure is formed over the substrate. The stacked gate structure includes a tunneling oxide layer, a floating gate, an inter-gate dielectric layer, a control gate and a cap layer sequentially formed over the substrate. A first conductive type pocket doped region is formed in a substrate area designated for forming a drain region. The first conductive type pocked doped region extends to the area underneath the stacked gate structure adjacent to a substrate area designated for forming a source region. Thereafter, a source region and a drain region are formed in the substrate on each side of the stacked gate structure and spacers are formed on the sidewalls of the stacked gate structure. A first conductive type doped region is formed within the drain region. The first conductive type doped region passes through a junction between the drain region and the first conductive type pocket doped region. An inter-layer dielectric layer is formed over the substrate and a portion of the inter-layer dielectric layer and the spacers are removed to form a contact hole. The contact hole exposes the drain region and the first conductive type pocket doped region and separates the first conductive type doped region from the spacer by a distance. Finally, a contact plug is formed in the contact hole connecting the drain region and the first conductive type doped region electrically.

In the aforementioned fabricating method, by forming the first conductive type doped region that passes through and shorts the drain region and the first conductive type pocket doped region, the original vertical contact between the contact plug and the drain region is converted to a horizontal contact. Hence, the overall contact area between the contact plug and the drain region is increased and resistance between the contact plug and the first conductive type pocket doped region or the drain region is reduced.

In other words, the flash memory cell can have a higher read-out rate and a better performance.

Furthermore, by forming the first conductive type doped region that passes through the drain region and shorts with the first conductive type pocket doped region, there is no need to form a contact plug that passes through the drain region and the first conductive type pocket doped region. In the process of forming the contact plug, only a portion of the inter-layer dielectric layer and a portion of the spacers need to be etched away to form the contact hole. Hence, there is no need to etch two different types of materials (silicon oxide and silicon). Consequently, the etching process for forming the contact hole is easier to perform and depth of the contact hole is easier to control. In other words, the contact plug has a wider processing window. In addition, it is now possible to fabricate the contact plug in the memory cell region and the contact plugs in the peripheral circuit region together. Therefore, late stage processing is very much simplified by the fabricating method.

This invention also shortens the distance separating neighboring stacked gate structures (that is, the width of the source region is smaller). Thus, the spacer on the sidewall of the stacked gate structure adjacent to the source region is able to connect with and cover the source region. In a subsequent process, the stacked gate structure with the spacers thereon can be directly used as a self-aligned mask to form the first conductive type doped region that passes through the drain region and the first conductive type pocket doped region. In other words, the fabrication process is simplified. Furthermore, the spacer can be a single or a double layer spacer. By forming a double-layered spacer each having a different etching rate such that the outer spacer has an etching rate identical to the inter-layer dielectric layer, the inner spacer can be used as an etching mask to increase the processing window for fabricating the contact plug.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3I are schematic cross-sectional views showing the progression of steps for fabricating a flash memory cell according to this invention.

DESCRIPTION OF THE PREFERRED EMBODIMENTS

Figure 1:
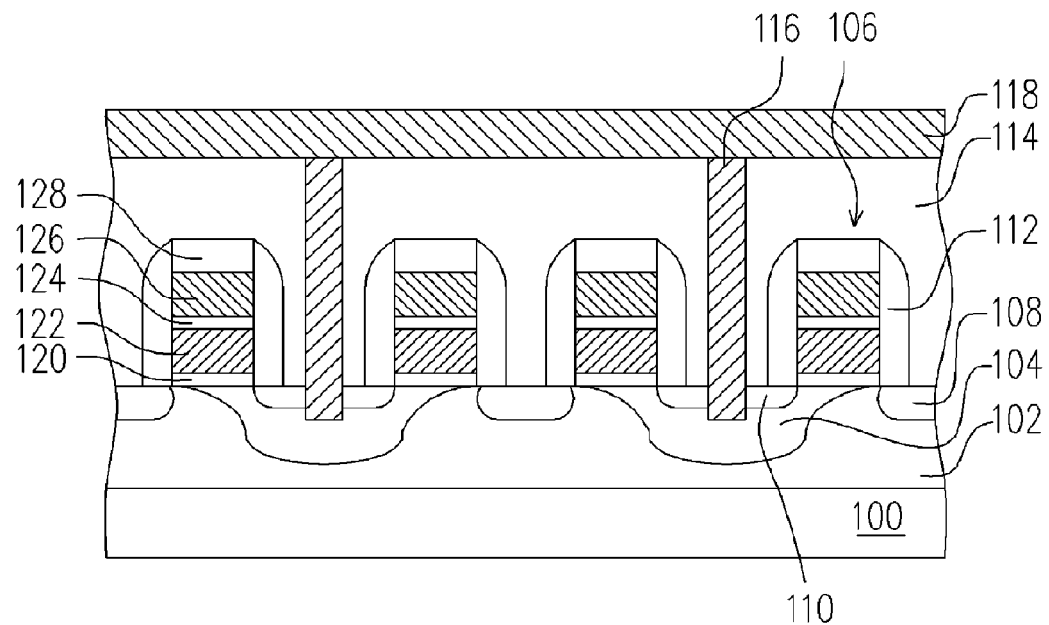
FIG. 1 is a schematic cross-sectional view showing the structure of a conventional stacked gate flash memory cell.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
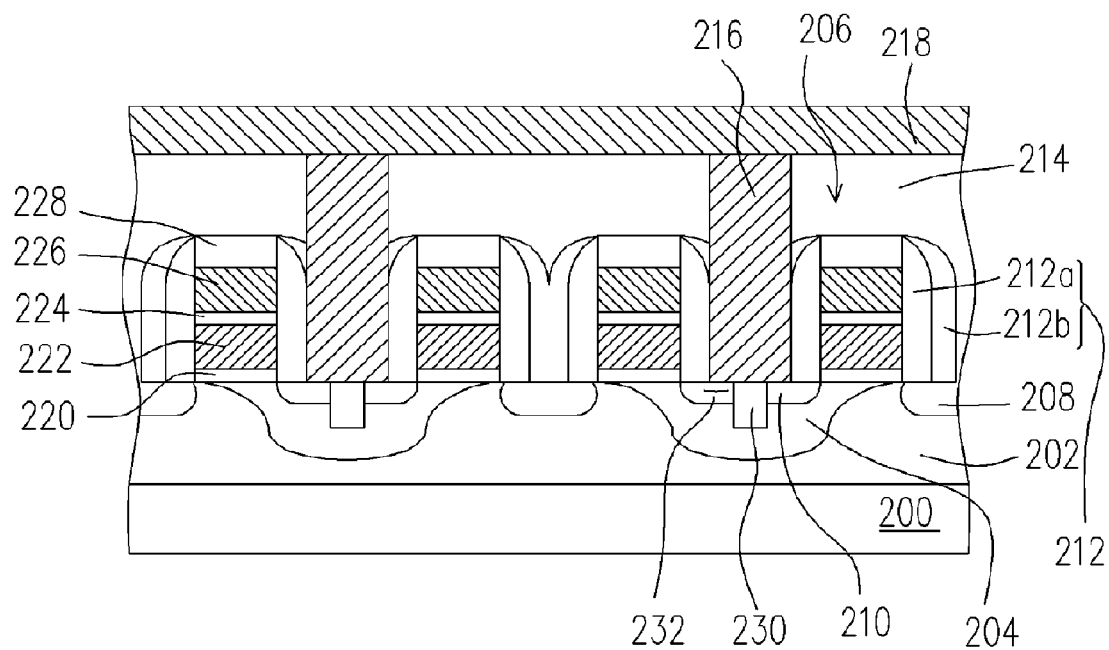
FIGS. 2A through 2C are schematic cross-sectional views showing the structure of flash memory cells according to this invention.
Figure 2B:
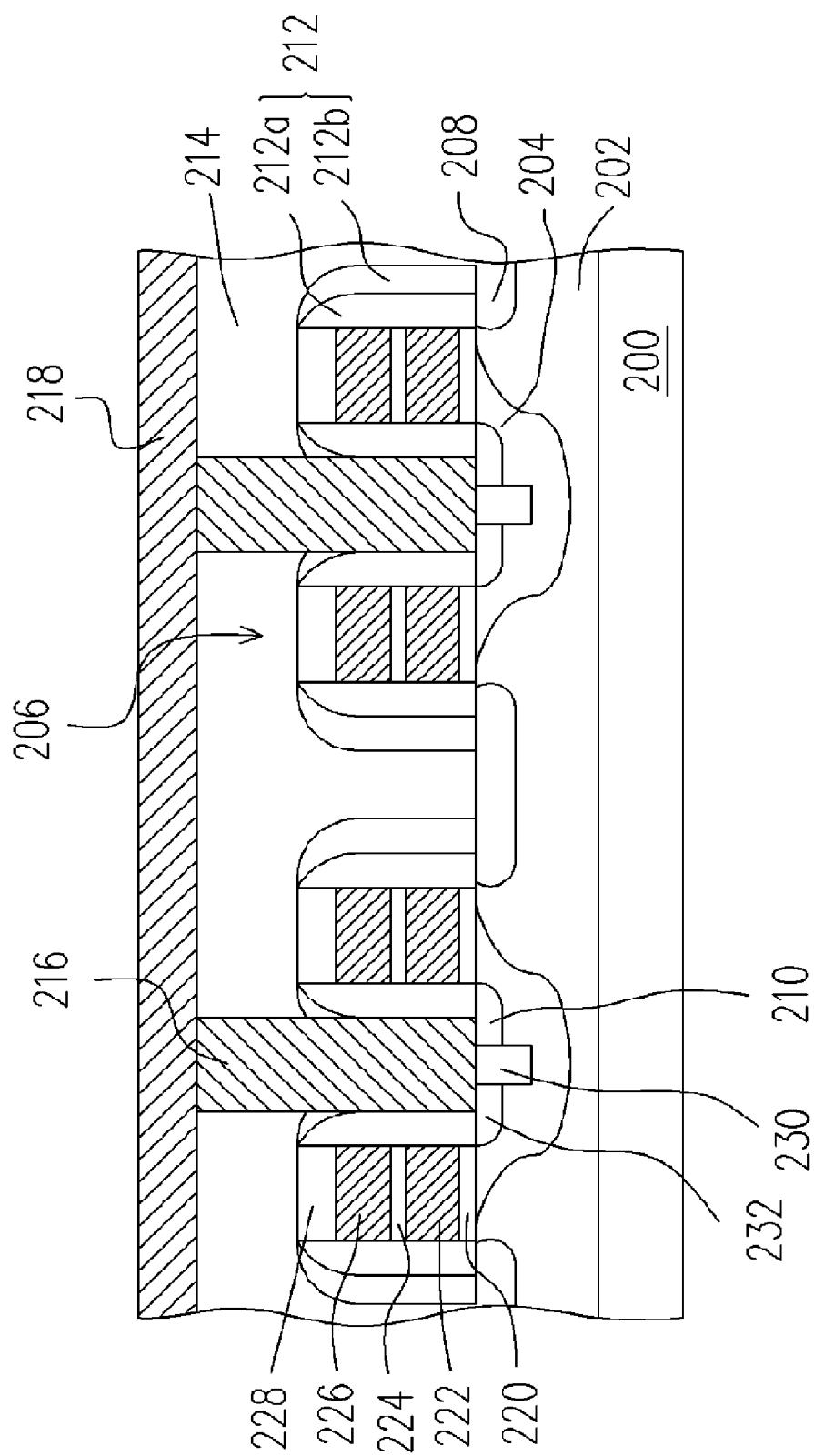
Figure 2C:
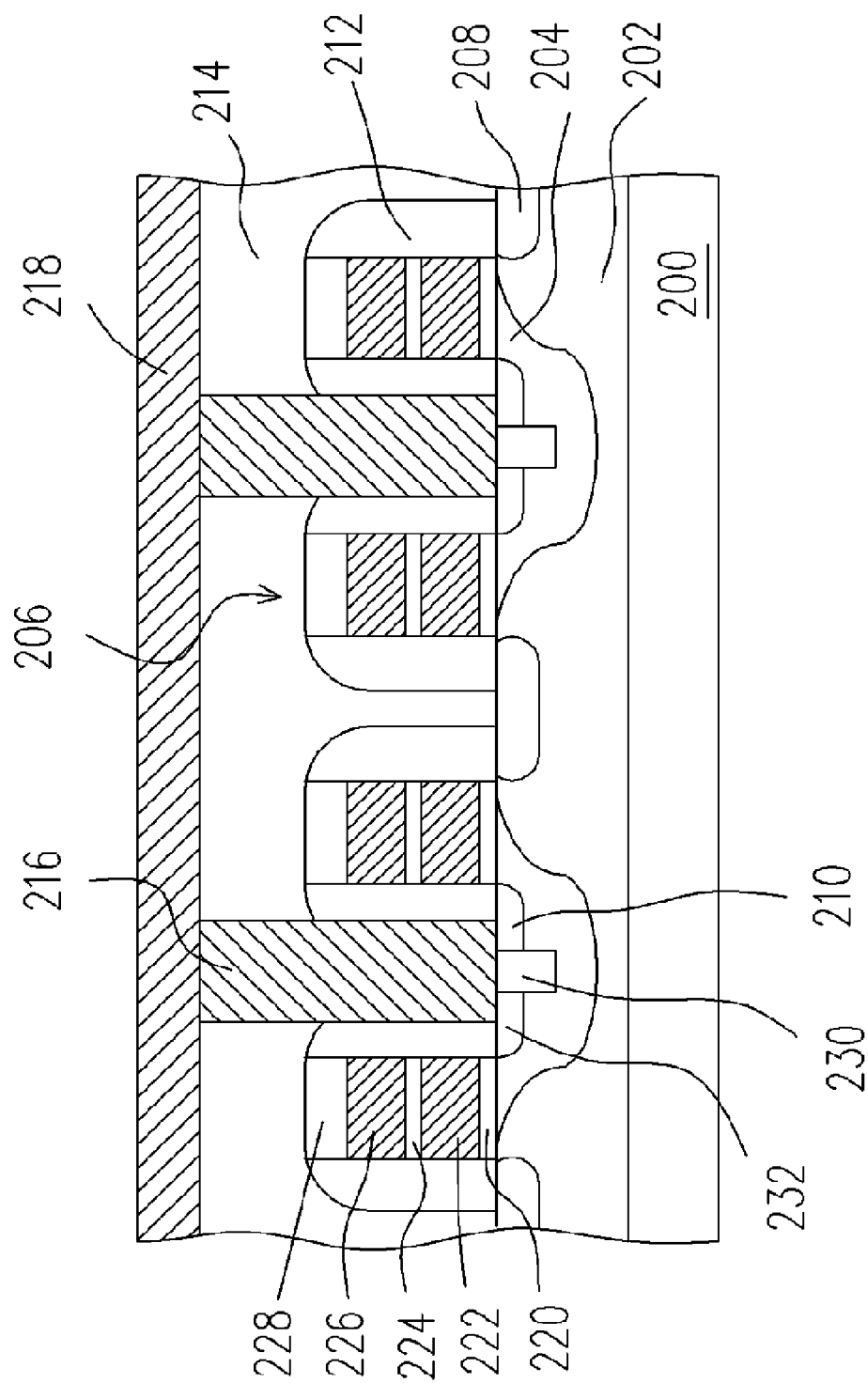

FIG. 2A is a schematic cross-sectional view showing the structure of a flash memory cell according to this invention. FIGS. 2B and 2C are schematic cross-sectional views showing other flash memory cell structures according to this invention. In FIGS. 2B and 2C, components identical to the ones in FIG. 2A are labeled identically. As shown in FIG. 2A, the flash memory of this invention includes a p-type substrate 200, a deep n-well region 202, a p-type pocket doped region 204, a stacked gate structure 206, a source region 208, a drain region 210, spacers 212, an inter-layer dielectric layer 214, a contact plug 216, a conductive line 218 (a bit line) and a p-type doped region 230. The stacked gate structure 206 further includes a tunneling oxide layer 220, a floating gate 222, an inter-gate dielectric layer 224, a control gate 226 and a gate cap layer 228.

The deep n-well region 202 is located within the p-type substrate 200. The stacked gate structure 206 is set up over the p-type substrate 200. The source region 208 and the drain region 210 are set up within the p-type substrate 200 on each side of the stacked gate structure 206. The p-type pocket doped region 204 is located within the deep n-well region 202 and extends to an area underneath the stacked gate structure 206 adjacent to one side of the source region 208.

The spacers 212 are attached to the sidewalls of the stacked gate structure 206. Each spacer 212 may include of an inner spacer 212a and an outer spacer 212b. The inner spacer 212a and the outer spacer 212b are fabricated with materials having different etching selectivity. For example, the outer spacer 212b is formed using a material having an etching selectivity identical to the inter-layer dielectric layer. Furthermore, the outer spacer 212b on the side closest to the source region 208 not only connects with the source region 208 but also covers a portion of the source region 208.

The inter-layer dielectric layer 214 is set up over the p-type substrate 200. The contact plug 216 is set up within the inter-layer dielectric layer 214 for connecting electrically with the drain region 210. The p-type doped region 230 is set up within the drain region 210. The p-type doped region 230 passes through a junction between the drain region 210 and the p-type pocket doped region 204 but is detached from the spacer 212a by a distance 232. The distance 232 is greater than the overall depth of the drain region 210, for example.

In this invention, the p-type pocket doped region 204 and the drain region 210 are short-circuit connected together to increase the read-out rate of each flash memory cell. Furthermore, using the p-type doped region 230 to connect the drain region 210 and the p-type pocket doped region 204 together and separating the p-type doped region 230 from the spacer 212a by the distance 232, the original vertical contact between the contact plug 216 and the drain region 210 is converted to a horizontal contact. Hence, the overall contact area between the contact plug 216 and the drain region 210 is increased and resistance between the contact plug 216 and the p-type pocket doped region 204 or the drain region 210 is reduced. Ultimately, the flash memory cell can have a higher read-out rate and a better performance.

In the aforementioned embodiment, the spacer 212 has a double-layered structure (the spacer 212a and the spacer 212b). Furthermore, the spacer 212b on the side of the stacked gate structure 212 close to the source region 208 connects with and covers the entire source region 208. However, the flash memory cell of this invention can have a structure shown in FIG. 2B. Here, the spacer 212b on the side of the stacked gate structure 212 close to the source region 208 does not cover the entire source region 208. However, the p-type doped region 230 still separates from the spacer 232b by a distance 232. In addition, the flash memory cell can be constructed in a form shown in FIG. 2C. Here, the spacer 212 is a single-layered structure with the p-type doped region 230 separated from the spacer 212 by a distance 232. Hence, the flash memory cell according to this invention is not limited by the configuration of the spacer 212. The effect of this invention can be achieved as long as the p-type doped region 230 separates from the spacer 212 by a distance 232, and the distance 232 is greater than the depth of the drain region 210, for example.

Figure 3A:
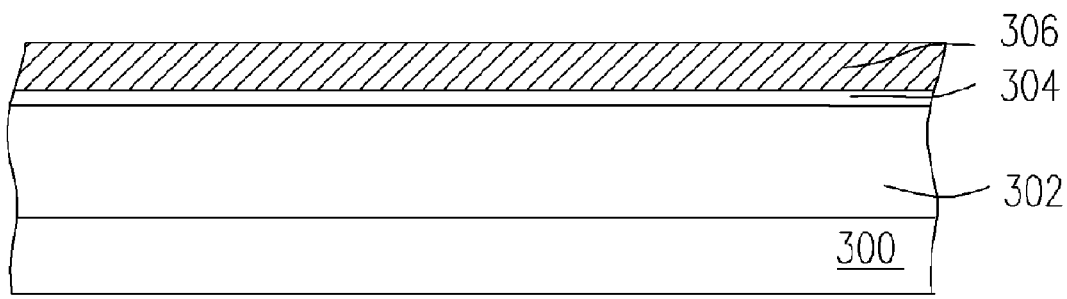

FIGS. 3A through 3I are schematic cross-sectional views showing the progression of steps for fabricating a flash memory cell according to this invention. A bi-directional NOR (BiNOR) gate flash memory array with a structure shown in FIG. 2A is used as an example. First, as shown in FIG. 3A, a p-type substrate 300 having some device isolation structures (not shown) thereon is provided. The device isolation structures have a linear layout that partitions out various active regions. In general, the device isolation structures are formed, for example, by performing a local oxidation of silicon (LOCOS) or a shallow trench isolation (STI) process. A deep n-well region 302 is formed in the p-type substrate 300. Thereafter, an oxide layer 304 is formed over the p-type substrate 300, for example, by performing a thermal oxidation process. The oxide layer 304 serves as a tunneling oxide layer and has a thickness between 90 Å and 100 Å. A conductive layer (not shown) is formed over the oxide layer 304. The conductive layer is a doped polysilicon layer with a thickness of about 800 Å formed, for example, by performing a chemical vapor deposition process to form an undoped polysilicon layer and carrying out an implantation thereafter. The conductive layer is patterned to form a linear conductive layer 306 over the active region.

Figure 3B:
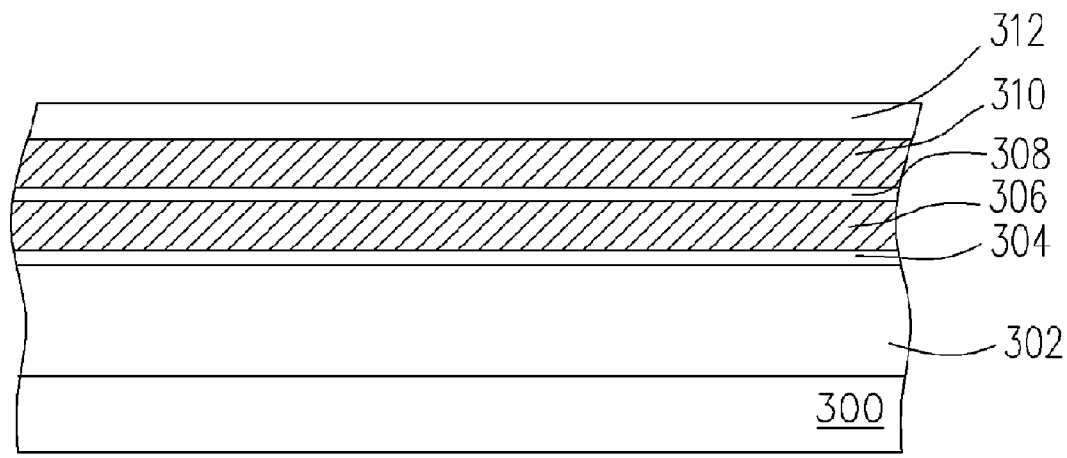

As shown in FIG. 3B, an inter-gate dielectric layer 308, a conductive layer 310 and a cap layer 312 are sequentially formed over the substrate 300. The inter-gate dielectric layer 308 is an oxide/nitride/oxide composite layer with a thickness of 60 Å/70 Å/60Å respectively. The inter-gate dielectric layer 308 is formed, for example, by performing a low-pressure chemical vapor deposition process. Obviously, the inter-gate dielectric layer 308 can be a silicon oxide layer or an oxide/nitride composite layer as well. The conductive layer 310 is a doped polysilicon layer with a thickness of about 2000 Å, for example. The conductive layer 310 is formed, for example, by performing a chemical vapor deposition process with in-situ doping. However, the conductive layer 310 can also be a polycide layer. The polycide layer is formed, for example, by depositing polysilicon over the inter-gate dielectric layer 308 and then depositing metallic material to react with the polysilicon. The metallic material that reacts with polysilicon to form the polycide layer can be selected from a group consisting of nickel, tungsten, cobalt, titanium, platinum and palladium. The cap layer 312 with a thickness of about 1500 Å is fabricated using a material having an etching selectivity that differs from a subsequently formed inter-layer dielectric layer such as silicon nitride in a chemical vapor deposition process, for example.

Figure 3C:
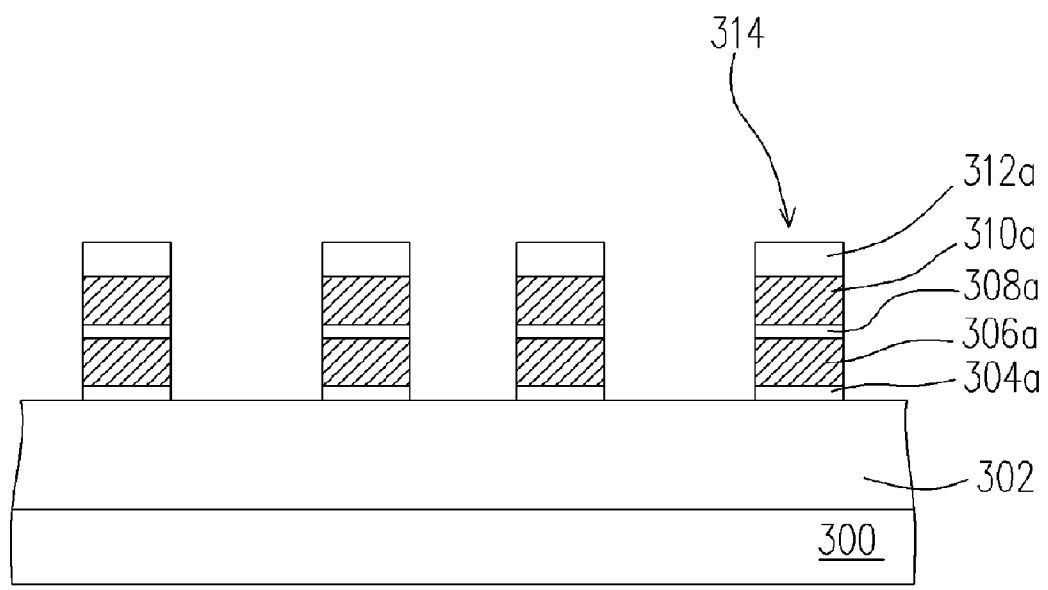

As shown in FIG. 3C, the cap layer 312 and the conductive layer 310 are patterned through a mask (not shown) to form a cap layer 312a and a conductive layer 310a that serves as a control gate. In the process of patterning the conductive layer 310a, the same mask is also used to pattern the inter-gate dielectric layer 308, the conductive layer 306 and the oxide layer 304 for forming the inter-gate dielectric layer 308a, the conductive layer 306a and the oxide layer 304a. The conductive layer 306a serves as a floating gate. In other words, the cap layer 312a, the conductive layer (the control gate) 310a, the inter-gate dielectric layer 308a, the conductive layer (the floating gate) 306a and the oxide layer (the tunnel oxide layer) 304a together form a stacked gate structure 314 of the flash memory cell.

Figure 3D:
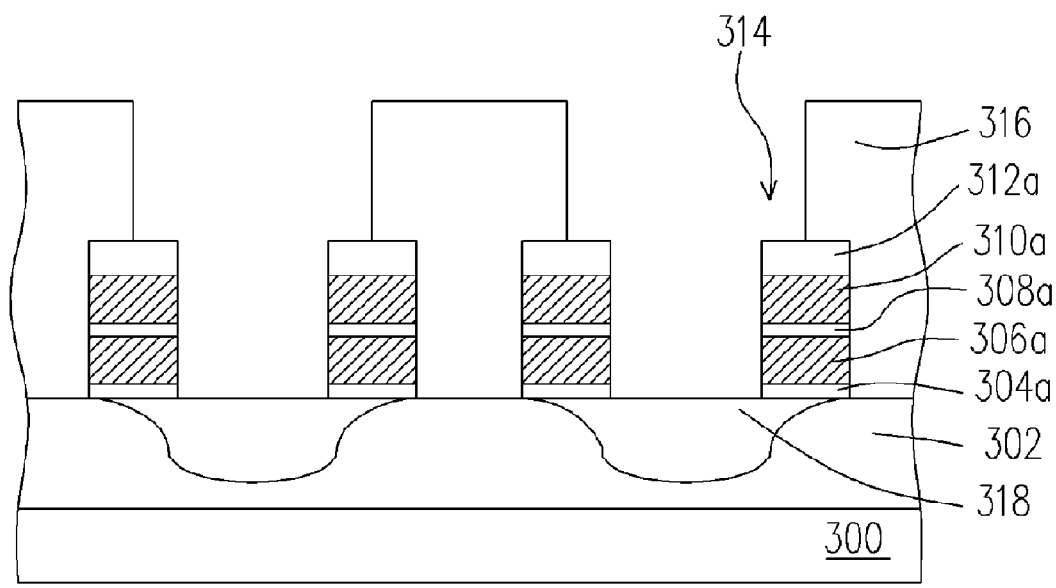

As shown in FIG. 3D, a patterned photoresist layer 316 is formed over the entire substrate 300. The patterned photoresist layer 316 exposes areas for forming drain regions. A pocket ion implantation is carried out using the stacked gate structure 314 and the patterned photoresist layer 316 as a mask so that dopants are implanted into the deep n-well region 302 of the substrate 300 close to the drain region to form a p-type pocket doped region 318. The pocket ion implantation includes a tilt ion implantation performing with dopants implanted at a tilt angle set to a value between 0° to 180°. Thus, the p-type pocket doped region 318 is able to extend from the area designated for forming the drain region to an area underneath the stacked gate structure 314 adjacent to an area designated for forming the source region.

Figure 3E:
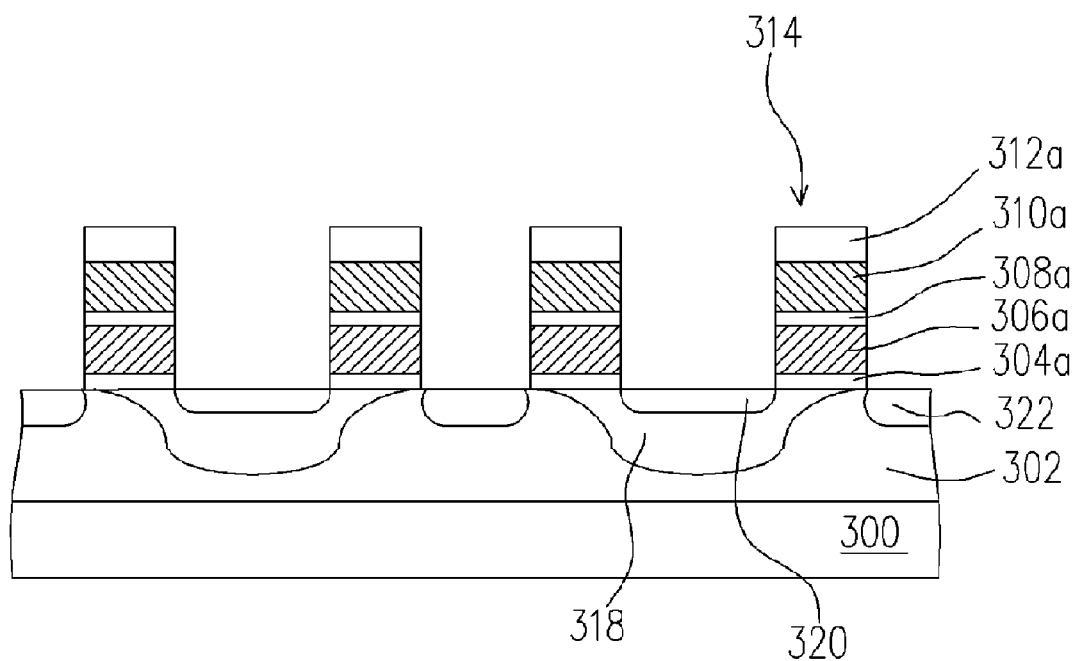

As shown in FIG. 3E, the patterned photoresist layer 316 is removed. A thermal processing operation is performed at a temperature of about 900° C. surrounded by gaseous oxygen dopants to drive-in dopants. Thereafter, using the stacked gate structure 314 as a mask, an ion implantation is carried out implanting dopants into the substrate 300 on each side of the stacked gate structure 314 to form a drain region 320 and a source region 322. The implanted dopants are n-type ions, for example.

Figure 3F:
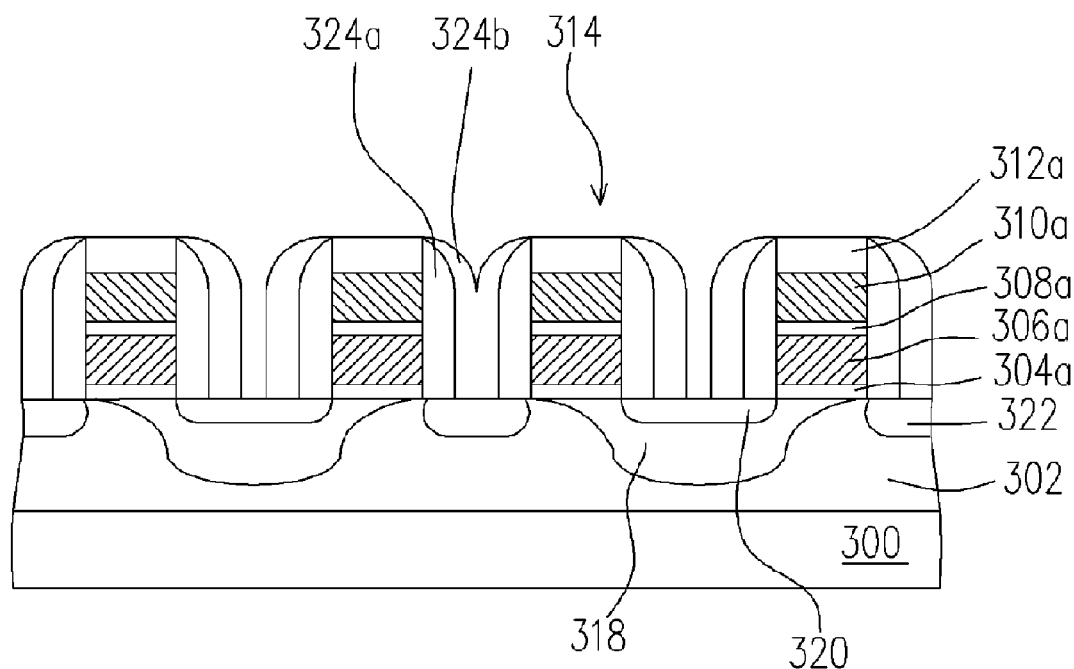

As shown in FIG. 3F, spacers 324a are formed on the sidewalls of the stacked gate structure 314. The spacers 324a are formed, for example, by deposition insulating material over the stacked gate structure 314 and the substrate 300 to form an insulation layer (not shown) that has an etching selectivity different from a subsequently formed inter-layer dielectric layer such as a silicon nitride layer and then removing a portion of the insulation layer by performing an anisotropic etching operation. Thereafter, another spacer 324b is formed on the spacer 324a covered sidewalls of the stacked gate structure 314. The spacers 324b are formed, for example, by deposition insulating material over the stacked gate structure 314, the spacers 324a and the substrate 300 to form an insulation layer (not shown) that has an etching selectivity similar to the subsequently formed inter-layer dielectric layer such as a silicon oxide layer, and then removing a portion of the insulation layer by performing an anisotropic etching operation. Furthermore, because the gap between two neighboring stacked gate structures 314 is rather small (width of the source region 322 is small), the spacers 324b on the source region 322 side of the stacked gate structures 324 connect and cover the source region 322. In a subsequent process, the stacked gate structures 314 together with the spacers 324b can be used as a self-aligned mask. Obviously, the spacers can have a structure similar to that in FIG. 2B, in which the spacers on the source side do not cover the entire source region or a structure similar to that in FIG. 2C, in which the spacers are single-layered structure.

Figure 3G:
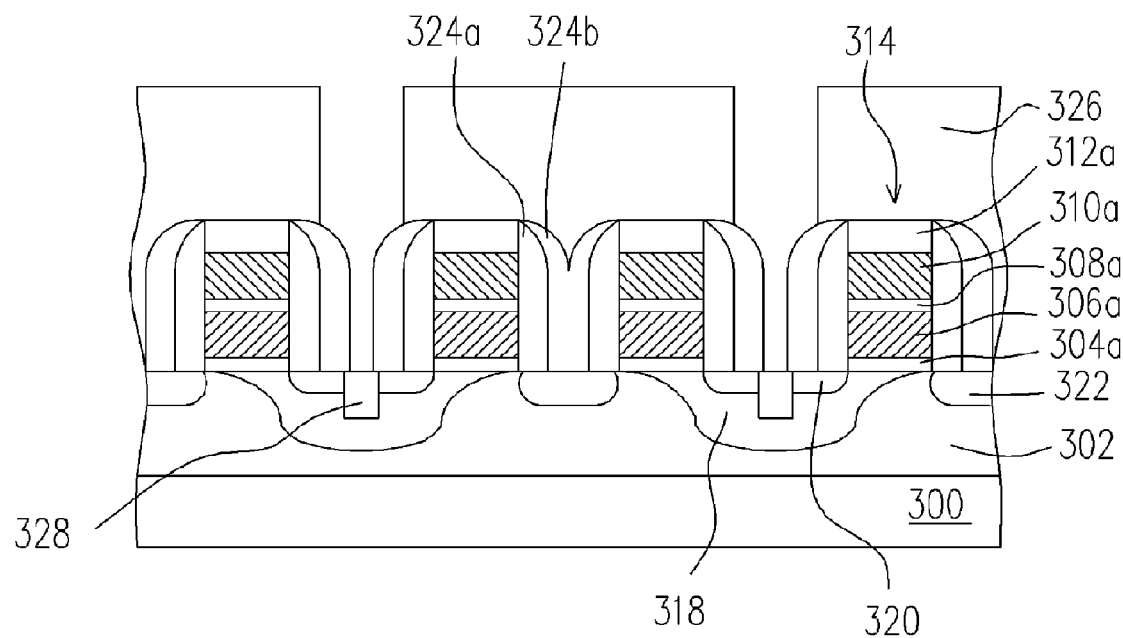

As shown in FIG. 3G, a patterned photoresist layer 326 is formed over the entire substrate 300. The patterned photoresist layer 326 exposes the drain region 320. Thereafter, using the patterned photoresist layer 326, the spacers 324a and 324b as a mask, an ion implantation is carried out implanting dopants into the drain region 320 to form a p-type doped region 328. The p-type doped region 328 passes through a junction between the drain region 320 and the p-type pocket doped region 318 and shorts the two together. In the implantation process, boron difluoride ($BF_2$) ions are used as the dopants, for example. Because the spacers 324b on each side of the stacked gate structures 314 completely covers the source region 322, the stacked gate structures 314 and the spacers 324b can be used as a self-aligned mask to form the p-type doped region 328 without forming the patterned photoresist layer.

Figure 3H:
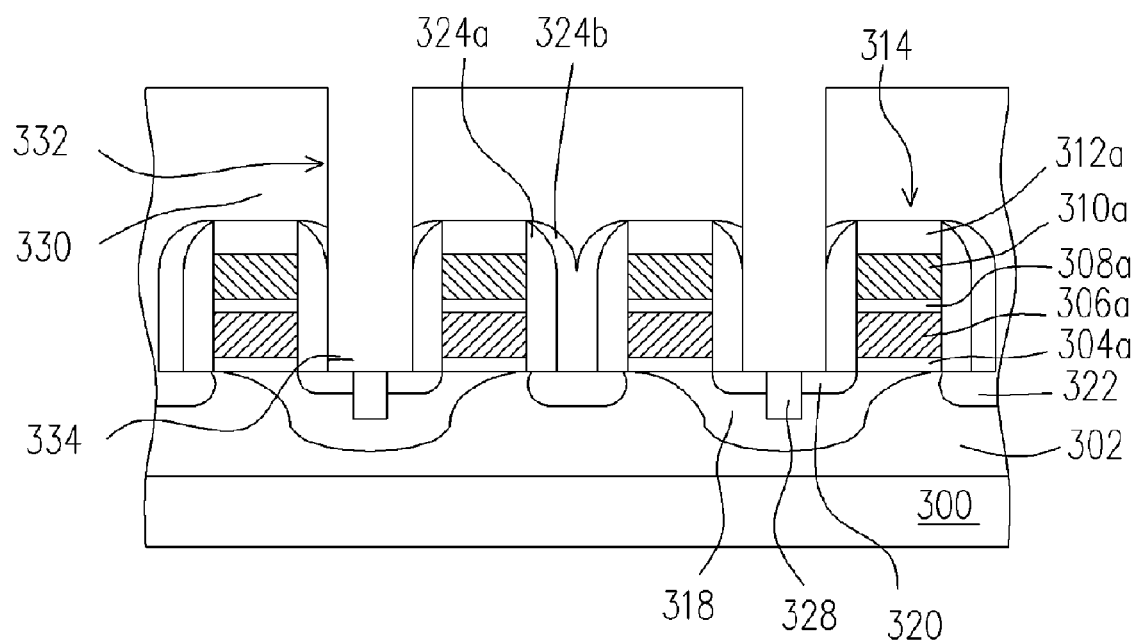
Figure 31:
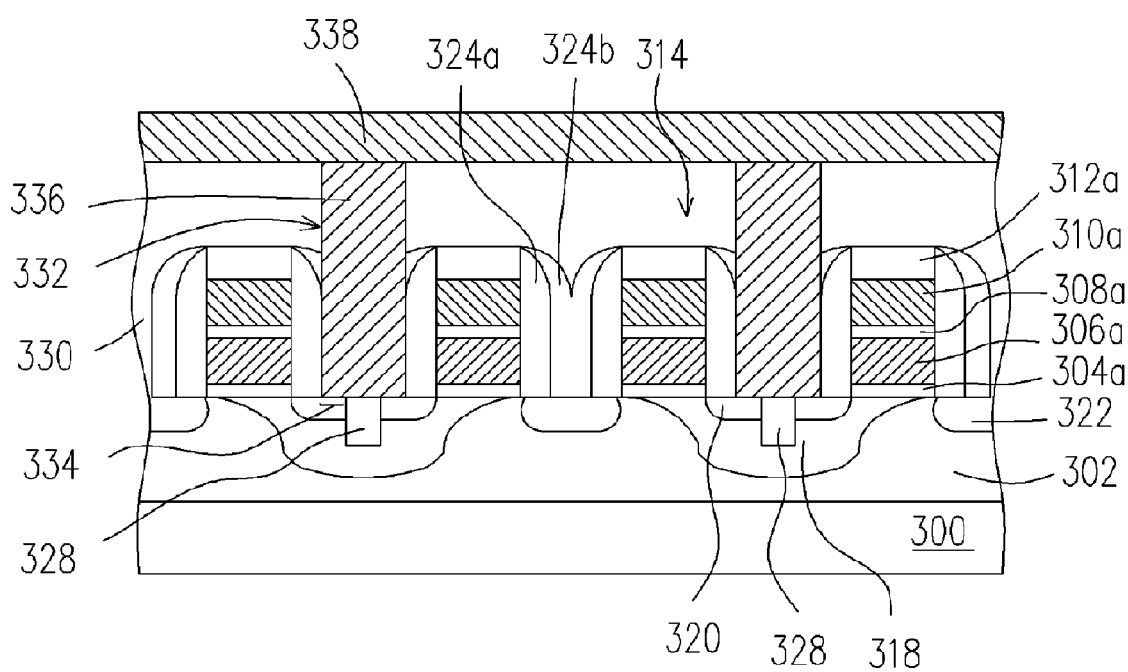

As shown in FIG. 3H, the patterned photoresist layer 326 is removed. Another inter-layer dielectric layer 330 is formed over the substrate 300. The inter-layer dielectric layer 330 is a borophosphosilicage glass (BPSG) layer or a phosphosilicate glass (PSG) layer formed, for example, by performing a chemical vapor deposition process. The inter-layer dielectric layer 330 is planarized, for example, by performing an etching back process or a chemical-mechanical polishing process. Thereafter, the inter-layer dielectric layer 330 is patterned to form contact holes 332 that expose the drain region 320 and the p-type doped region 328. Because the spacer 324a has an etching selectivity different from that of the inter-layer dielectric layer 330, and the spacer 324b has an etching selectivity similar to that of the inter-layer dielectric layer 330, the spacers 324b exposed through the contact hole 332 are also removed. Finally, the p-type doped region 328 separates from the spacer 324a (or any residual spacers 324b) by a distance 334.

As shown in FIG. 3I, a contact plug 336 is formed inside the contact hole 332 to connect the p-type doped region 328 and the drain region 320 electrically. The contact plug 336 is fabricated using a material including tungsten and formed by depositing conductive material into the contact hole 332, for example. Thereafter, a conductive line 338 is formed over the inter-layer dielectric layer 330 to connect with the contact plug 336. The conductive line 338 is formed, for example, depositing conductive material over the substrate 300 to form a conductive layer (not shown) and performing photolithographic and etching processes thereafter. Finally, other processes for fabricating a complete flash memory are performed. Since conventional processes are used, detailed description is omitted.

In the aforementioned fabricating method, by forming the p-type doped region 328 that passes through and shorts the drain region 320 and the p-type pocket doped region 318 together, the original vertical contact between the contact plug 336 and the drain region 320 is converted to a horizontal contact. Hence, the overall contact area between the contact plug 336 and the drain region 320 is increased and resistance between the contact plug 336 and the p-type pocket doped region 318 or the drain region 320 is reduced. In other words, the flash memory cell can have a higher read-out rate and a better performance.

Furthermore, by forming the p-type doped region 328 that passes through the drain region 320 and shorts with the p-type pocket doped region 318, there is no need to form the contact plug 336 that passes through the drain region 320 and the p-type pocket doped region 318. In the process of forming the contact plug 336, only a portion of the inter-layer dielectric layer 330 and a portion of the spacers 324b need to be etched away to form the contact hole 332. Hence, there is no need to etch two different types of materials (silicon oxide and silicon). Consequently, the etching process for forming the contact plug 336 is easier to perform and the depth of the contact hole 332 is easier to control. In other words, the contactplug 336 has a wider processing window. In addition, it is now possible to fabricate the contact plugs in the memory cell region and the contact plugs in the peripheral circuit region together. Therefore, late stage processing is very much simplified by the fabricating method.

This invention also shortens the distance separating neighboring stacked gate structures 314 (that is, the width of the source region 322 is smaller). Thus, the spacer 324b on the sidewall of the stacked gate structure 314 adjacent to the source region 322 is able to connect with and cover the source region 322. In a subsequent process, the stacked gate structures 314 with the spacers 324b thereon can be directly used as a self-aligned mask to form the p-type doped region 328 that passes through the drain region 320 and the p-type pocket doped region 318. In other words, the fabrication process is simplified.

Furthermore, the spacer can be a single or a double layer spacer. By forming a double-layered spacer each having a different etching rate such that the outer spacer has an etching rate identical to the inter-layer dielectric layer, the inner spacer can be used as an etching mask to increase the processing window for fabricating the contact plug.

Although the aforementioned embodiment uses a p-channel flash memory cell to illustrate the fabrication process, the method of this invention can also be applied to form an n-channel flash memory cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory cell, comprising the steps of:
   providing a first conductive type substrate;
   forming a second conductive type first well region in the substrate;
      forming a stacked gate structure over the substrate, wherein the stacked gate structure comprises a tunneling oxide layer, a floating gate, an inter-gate dielectric layer, a control gate and a cap layer sequentially formed over the substrate;
      forming a first conductive type pocket doped region in an area of the substrate designated for forming a drain region such that the first conductive type pocket doped region extends to an area underneath the stacked gate structure close to an area designated for forming the a source region;
      forming the source region and the drain region in the substrate on each side of the stacked gate structure;
   forming a pair of spacers on sidewalls of the stacked gate structure;
      forming a first conductive type doped region in the drain region, wherein the first conductive type doped region extends through a junction between the drain region and the first conductive type pocket doped region;
   forming an inter-layer dielectric layer over the substrate;
      removing a portion of the inter-layer dielectric layer and the spacer to form an contact hole, wherein the contact hole exposes the drain region and the first conductive type doped region such that the first conductive type doped region separates from the spacer by a distance; and
      forming a contact plug inside the contact hole, wherein the contact plug is connected to the first conductive type doped region electrically.

2. The method of claim 1, wherein the distance separating the first conductive type doped region from the spacer is greater than a depth of the drain region.

3. The method of claim 1, wherein the step of forming the first conductive type doped region in the drain region further comprises:
   forming a mask layer that exposes the drain region over the substrate;
   forming the first conductive type doped region in the substrate on one side of the drain region using the mask layer and the spacer as a self-aligned mask; and
   removing the mask layer.

4. The method of claim 3, wherein the step of forming the pair of spacers on the sidewalls of the stacked gate structure comprises:
   forming first spacers on the sidewalls of the stacked gate structure; and
      forming second spacers on the first spacer covered sidewalls of the stacked gate structure.

5. The method of claim 4, wherein the first spacers and the second spacers are fabricated with materials having different etching selectivity, and the step of removing a portion of the inter-layer dielectric layer and the spacers to form the contact hole comprises removing a portion of the second spacer so that the first conductive type doped region separates from the second spacer by a distance.

6. The method of claim 4, wherein the step of forming the first conductive type doped region in the drain region comprises using the stacked gate structure with the second spacers thereon as a self-aligned mask in an ion implantation process.

7. The method of claim 1, wherein the step of forming the first conductive type doped region in the drain region comprises using the stacked gate structure with the spacers thereon as a self-aligned mask in an ion implantation process.

8. The method of claim 3, wherein the step of forming the first conductive type pocket doped region in an area designated form forming the drain region comprises:
   forming a first patterned photoresist layer over the substrate, wherein the first patterned photoresist layer exposes the area in the substrate designated for forming the drain region;
   performing a first pocket implantation to form the first conductive type pocket doped region in the designated substrate area for forming the drain region; and
   removing the first patterned photoresist layer.

9. The method of claim 8, wherein the first pocket implantation comprises a tilt angle ion implantation operation.

* * * * *